United States Patent
Hsieh et al.

(10) Patent No.: US 11,375,608 B2
(45) Date of Patent: Jun. 28, 2022

(54) ELECTROMAGNETIC BAND GAP STRUCTURE APPARATUS

(71) Applicant: Realtek Semiconductor Corporation, Hsinchu (TW)

(72) Inventors: Hsin-Chan Hsieh, New Taipei (TW); Ruey-Beei Wu, Taipei (TW); Shih-Hung Wang, Hsinchu (TW); Ting-Ying Wu, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 82 days.

(21) Appl. No.: 16/936,869

(22) Filed: Jul. 23, 2020

(65) Prior Publication Data

US 2021/0185799 A1 Jun. 17, 2021

(30) Foreign Application Priority Data

Dec. 13, 2019 (TW) ................... 108145853

(51) Int. Cl.
| | | |
|---|---|---|
| H05K 1/02 | (2006.01) | |
| H05K 1/18 | (2006.01) | |
| H01P 1/20 | (2006.01) | |
| H01P 3/123 | (2006.01) | |

(52) U.S. Cl.
CPC ......... *H05K 1/0236* (2013.01); *H01P 1/2005* (2013.01); *H01P 3/123* (2013.01); *H05K 1/181* (2013.01)

(58) Field of Classification Search
CPC ...... H05K 1/0236; H05K 1/181; H01P 3/123; H01P 1/2005
See application file for complete search history.

(56) References Cited

U.S. PATENT DOCUMENTS 10,856,405 B2 * 12/2020 Wang ................... H01P 7/082

FOREIGN PATENT DOCUMENTS

| CN | 101212860 A | 7/2008 |
| CN | 101714681 A | 5/2010 |
| CN | 105794043 A | 7/2016 |
| TW | I645774 B | 12/2018 |

OTHER PUBLICATIONS

Hsieh et al., Nonperiodic Flipped EBG for Dual-Band SSN Mitigation in Two-Layer PCB, IEEE Transactions on Components, Packaging and Manufacturing Technology, 2019, pp. 1690-1697, vol. 9, Issue: 9.
China Patent Office "Office Action", dated Nov. 19, 2021, China.

* cited by examiner

*Primary Examiner* — Stephen E. Jones
*Assistant Examiner* — Kimberly E Glenn
(74) *Attorney, Agent, or Firm* — Locke Lord LLP; Tim Tingkang Xia, Esq.

(57) ABSTRACT

An electromagnetic band gap structure apparatus includes a first conducting layer having at least one first slot. Each of the at least one slot is arranged with a planar conductor unit, and the each planar conductor unit is coupled to a first via. The electromagnetic band gap structure apparatus further includes a second conducting layer in parallel with the first conducting layer. The second conducting layer has a second slot. The second slot is arranged with at least one planar transmission line unit. The each of the at least one planar transmission line unit is coupled to the first conducting layer through a second via, and the each first via is coupled to the second conducting layer.

19 Claims, 7 Drawing Sheets

US 11,375,608 B2

ELECTROMAGNETIC BAND GAP STRUCTURE APPARATUS

RELATED APPLICATIONS

This application claims priority to Taiwan Application Serial Number 108145853, filed Dec. 13, 2019, which is herein incorporated by reference.

BACKGROUND

Field of Invention

The present disclosure relates to an electromagnetic band gap structure apparatus. More particularly, the present disclosure relates to an electromagnetic band gap structure apparatus in an integrated circuit.

Description of Related Art

In the prior art, a certain number of electromagnetic band gap (EBG) structures need to be repeatedly disposed to achieve a better noise suppression effect. However, it's more difficult to perform the disposing of multiple electromagnetic band gap structure units within a limited space in the aspect of practical application.

Although there is the flipped stepped impedance resonator (FSIR) electromagnetic band gap structure in the prior art that can also be used for noise suppression, this kind of electromagnetic band gap structure tends to interact with the slot resonance at the second frequency band ranging from 5 to 6 GHz. It is difficult to improve the noise suppression effect on the second frequency band.

For the foregoing reasons, there is a need to solve the above-mentioned problems by providing an electromagnetic band gap structure apparatus.

SUMMARY

In order to resolve the above-mentioned problems, at least one objective of the present disclosure is to provide an electromagnetic band gap structure apparatus, especially a non-periodic electromagnetic band gap structure apparatus that combines an open-stub structure and a slot resonator and adopts a flipped configuration, which can achieve a better noise suppression effect.

One aspect of the present disclosure provides an electromagnetic band gap structure apparatus. The electromagnetic band gap structure apparatus comprises a first conducting layer and a second conducting layer. The second conducting layer is in parallel with the first conducting layer. The first conducting layer has at least one first slot. Each of the at least one first slot is arranged with a planar conductor unit, and the each planar conductor unit is electrically coupled to a first via. The second conducting layer has a second slot. The second slot is arranged with at least one planar transmission line unit. The each of the least one planar transmission line unit is electrically coupled to the first conducting layer through a second via, and the each first via is electrically coupled to the second conducting layer.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
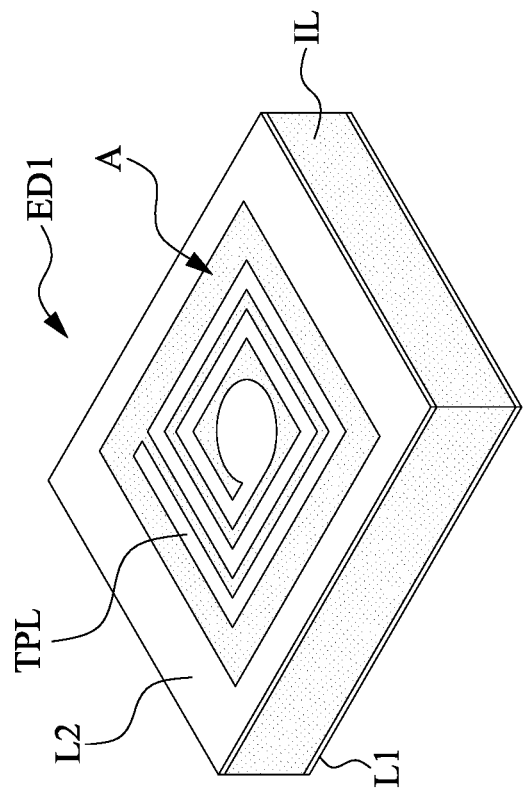
FIG. 1 depicts a schematic diagram of an electromagnetic band gap structure apparatus according to one embodiment of the present disclosure.

FIG. 1 depicts a schematic diagram of an electromagnetic band gap structure apparatus according to one embodiment of the present disclosure. In some embodiments, an electromagnetic band gap structure apparatus ED1 includes a first conducting layer L1 and a second conducting layer L2, which are two approximately parallel planes made of a conductive material, and an insulating layer IL is filled between the two. FIG. 1 depicts an exterior structure of the electromagnetic band gap structure apparatus ED1, and is used for illustrating the arrangement on the second conducting layer L2. Since an interior structure of the electromagnetic band gap structure apparatus ED1 and a structure of the first conducting layer L1 located on another side are shielded by the insulating layer IL in FIG. 1, a description is provided later.

As shown in FIG. 1, the second conducting layer L2 has a rectangular slot A so that the second conducting layer L2 has an approximately rectangular ring shape. The slot A is arranged with one planar transmission line unit TPL in it, which is made of a conductive material, and the planar transmission line unit TPL is separated from the second conducting layer L2 by the slot A. That is, the planar transmission line unit TPL is electrically isolated from the second conducting layer L2.

In some embodiments, the first conducting layer L1 is a ground plane and is coupled to a ground voltage (such as a voltage VSS). The second conducting layer L2 is a source plane and is coupled to a power voltage (such as a voltage VDD).

Figure 2:
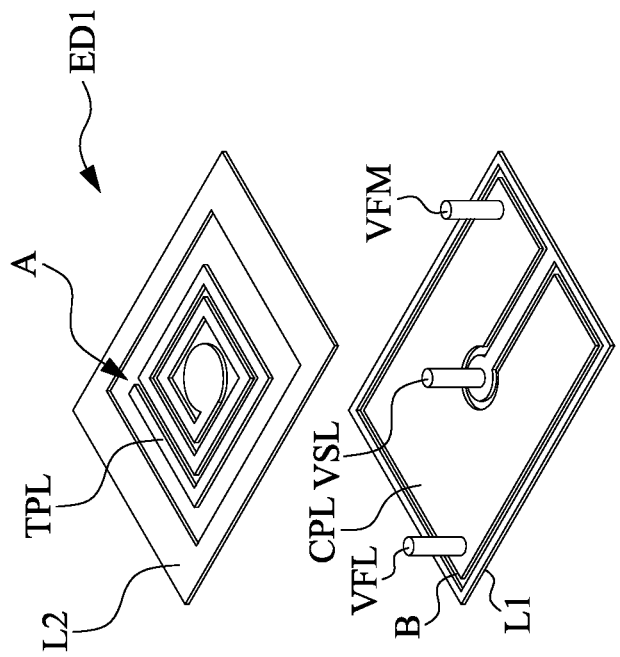
FIG. 2 depicts a schematic exploded view of an electromagnetic band gap structure apparatus ED1.

FIG. 2 depicts a schematic diagram of an electromagnetic band gap structure apparatus according to some embodiments of the present disclosure. A description is provided also with reference to FIG. 1, however, FIG. 2 shows the first conducting layer L1 and the second conducting layer L2 in an exploded state, and the insulating layer IL is not depicted. In the manner shown in FIG. 2, the understanding of the structural relationship between the first conducting layer L1 and the second conducting layer L2 can be facilitated.

As shown in FIG. 2, the first conducting layer L1 has a slot B. The slot B is arranged with a planar conductor unit CPL in it. The planar conductor unit CPL is made of a conductive material, and is conformal with the slot B. In other words, a shape in which the slot B is arranged forms a shape of the planar conductor unit CPL. The planar conductor unit CPL is separated from the first conducting layer L1 by the slot B, so that the planar conductor unit CPL is electrically isolated from the first conducting layer L1. One side of the slot B has an inward rotation design, so that the first conducting layer L1 has one extending end that extends to a center region of the slot B.

As shown in FIG. 2, a first via VFL and a first via VFM are respectively disposed at two corners of the planar conductor unit CPL. The first via VFL and the first via VFM are respectively configured to couple the planar conductor unit CPL to the second conducting layer L2. Both the first via VFL and the first via VFM are approximately perpendicular to the first conducting layer L1 and the second conducting layer L2.

As shown in FIG. 2, a second via VSL is disposed at the extending end of the first conducting layer L1 that extends into a slit of the slot B. The second via VSL is configured to couple the first conducting layer L1 to the planar transmission line unit TPL. The second via VSL is approximately perpendicular to the first conducting layer L1 and the second conducting layer L2.

Figure 3:
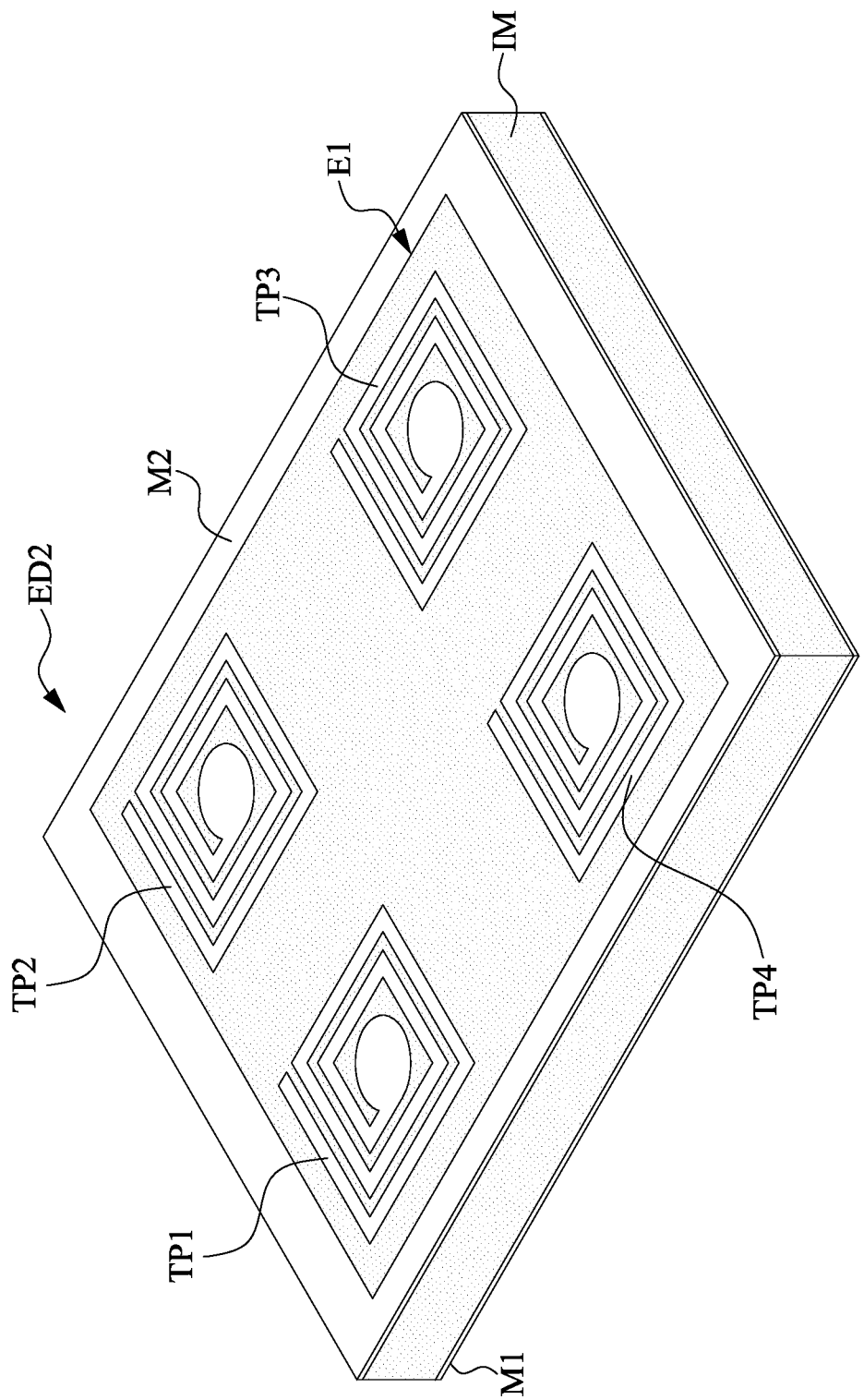
FIG. 3 depicts a schematic diagram of an electromagnetic band gap structure apparatus according to another embodiment of the present disclosure.

FIG. 3 depicts a schematic diagram of an electromagnetic band gap structure apparatus according to some embodiments of the present disclosure. In some embodiments, an electromagnetic band gap structure apparatus ED2 includes a first conducting layer M1 and a second conducting layer M2, which are two planes made of a conductive material. The first conducting layer M1 and the second conducting layer M2 are arranged approximately in parallel, and an insulating layer IM is filled between the two. FIG. 3 depicts an exterior structure of the electromagnetic band gap structure apparatus ED2, and is used for illustrating the arrangement on the second conducting layer M2. Since an interior structure of the electromagnetic band gap structure apparatus ED2 and a structure of the first conducting layer M1 located on another side are shielded by the insulating layer 1M in FIG. 3, a description is provided later.

As shown in FIG. 3, the second conducting layer M2 has a rectangular slot E1 so that the second conducting layer M2 has an approximately rectangular ring shape. The slot E1 is arranged with four planar transmission line units TP1-TP4 in it. The planar transmission line units TP1-TP4 are all made of a conductive material, and the planar transmission line units TP1-TP4 are separated from the second conducting layer M2 by the slot E1. In other words, the planar transmission line units TP1-TP4 are electrically isolated from the second conducting layer M2.

In some embodiments, the first conducting layer M1 is a ground plane and is coupled to a ground voltage (such as a voltage VSS). The second conducting layer M2 is a source plane and is coupled to a power voltage (such as a voltage VDD).

Figure 4:
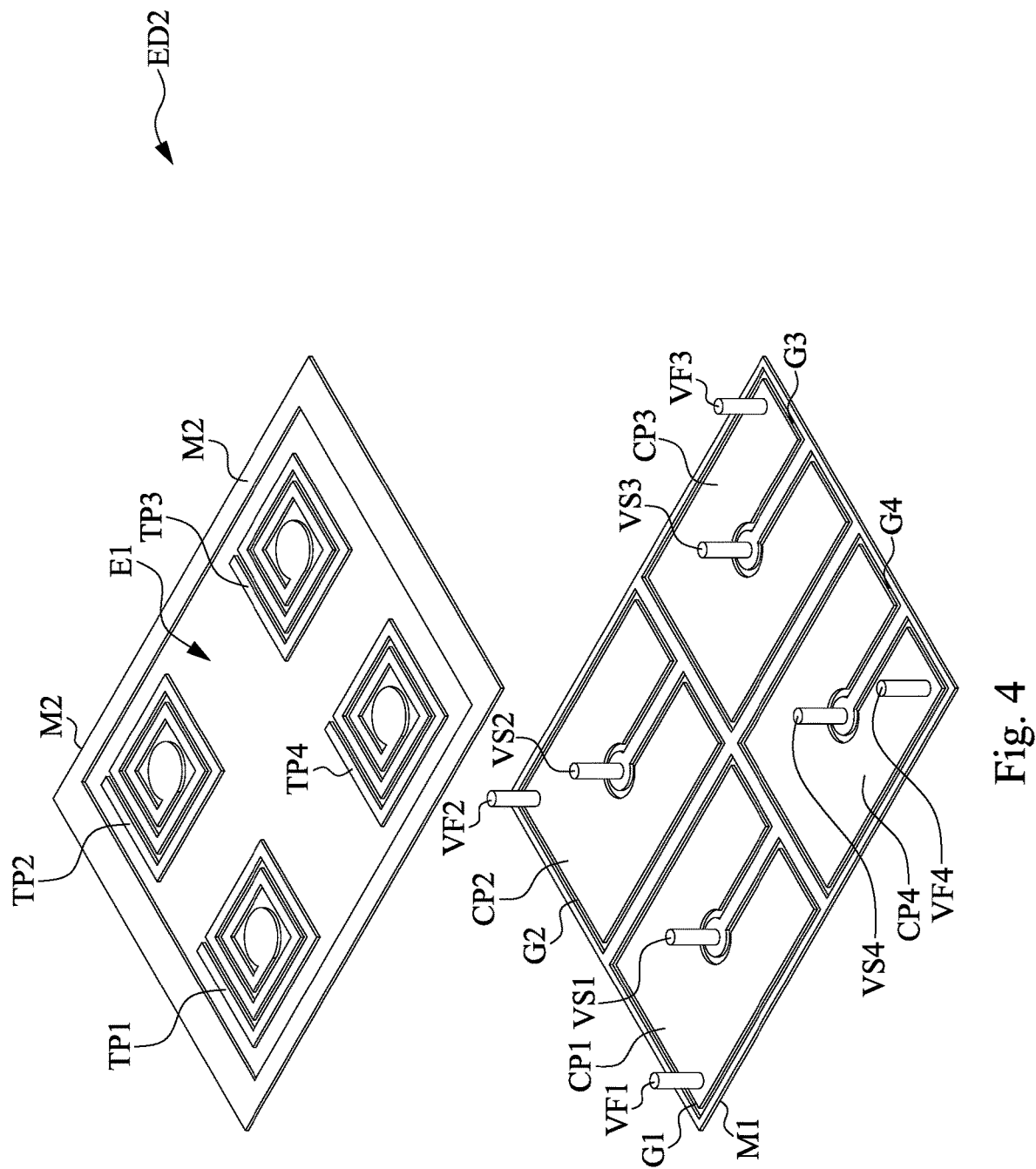
FIG. 4 depicts a schematic exploded view of an electromagnetic band gap structure apparatus ED2.

FIG. 4 depicts a schematic diagram of an electromagnetic band gap structure apparatus according to some embodiments of the present disclosure. A description is provided also with reference to FIG. 3, however, FIG. 4 shows the first conducting layer M1 and the second conducting layer M2 in an exploded state, and the insulating layer IM is not depicted. In the manner shown in FIG. 4, the understanding of the structural relationship between the first conducting layer M1 and the second conducting layer M2 can be facilitated.

As shown in FIG. 4, the first conducting layer M1 has four slots G1-G4. The first conducting layer M1 has the slots G1-G4 arranged adjacent to one another and in two columns and two rows (that is, 2×2). The slot G1 is arranged with a planar conductor unit CP1 in it. The slot G2 is arranged with a planar conductor unit CP2 in it. The slot G3 is arranged with a planar conductor unit CP3 in it. The slot G4 is arranged with a planar conductor unit CP4 in it. A description is provided with reference to FIG. 4. The planar conductor units CP1-CP4 are also arranged in two columns and two rows (that is, 2×2), and are arranged in the slots G1-G4 and adjacent to one another. The planar conductor units CP1-CP4 are all made of a conductive material, and are respectively conformal with the slots G1-G4. In other words, a shape in which the slots G1-G4 are arranged forms a shape of the planar conductor units CP1-CP4. The planar conductor units CP1-CP4 are separated from the first conducting layer M1 by the slots G1-G4, respectively, so that the planar conductor units CP1-CP4 are electrically isolated from the first conducting layer M1. One side of each of the slots G1-G4 has an inward rotation design, so that the first conducting layer M1 has a plurality of extending ends that extend to center regions of the slots G1-G4.

As shown in FIG. 4, first vias VF1-VF4 are respectively disposed on the planar conductor units CP1-CP4. The first vias VF1-VF4 are configured to couple the four planar conductor units CP1-CP4 to the second conducting layer M2. The first vias VF1-VF4 are approximately perpendicular to the first conducting layer M1 and the second conducting layer M2.

As shown in FIG. 4, second vias VS1-VS4 are disposed at the extending ends of the first conducting layer M1 that extend into slits of the slots G1-G4. The second vias VS1-VS4 are respectively configured to couple the first conducting layer M1 to the planar transmission line units TP1-TP4. The second vias VS1-VS4 are approximately perpendicular to the first conducting layer M1 and the second conducting layer M2.

Figure 5:
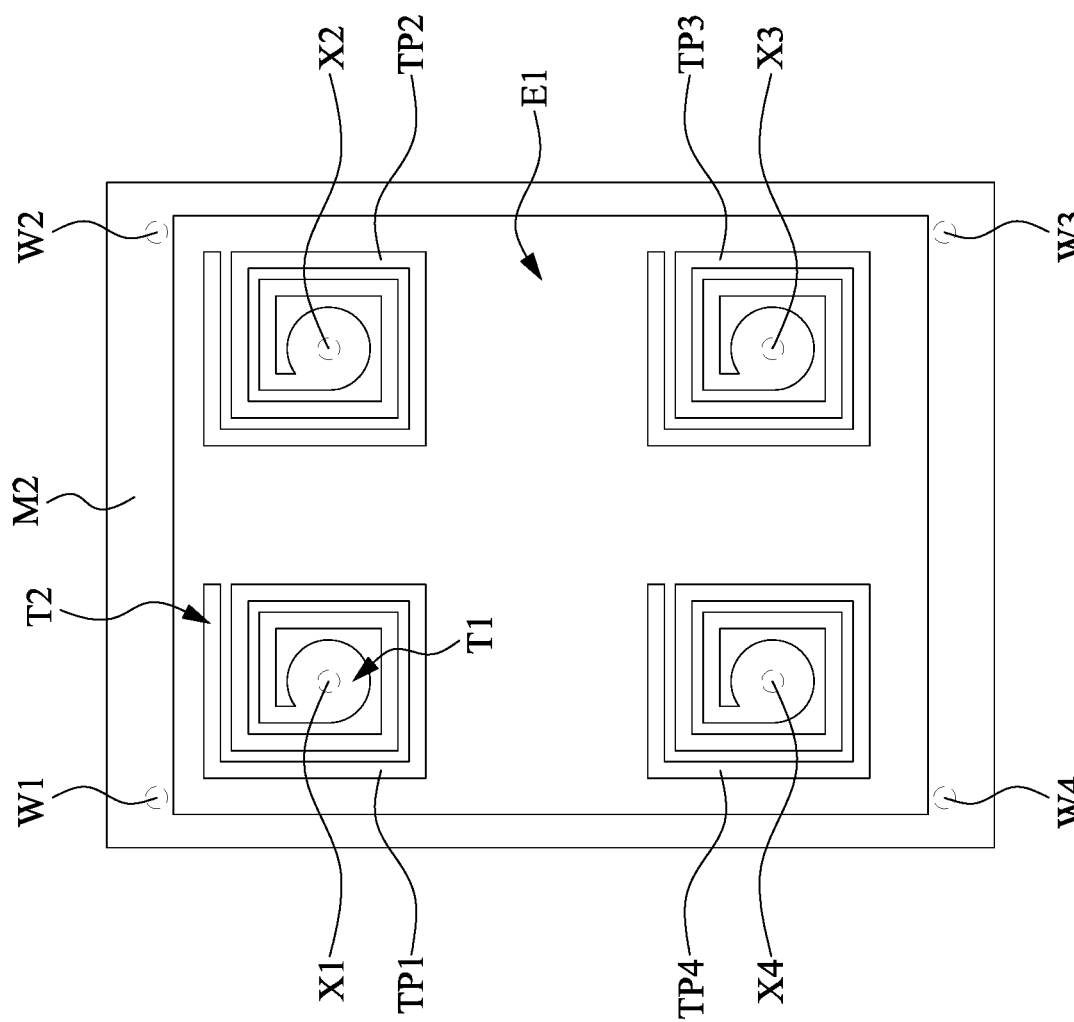
FIG. 5 depicts a schematic top view of the second conducting layer M2 of the electromagnetic band gap structure apparatus ED2.

FIG. 5 depicts a schematic top view of the electromagnetic band gap structure apparatus ED2, which shows the second conducting layer M2 of the electromagnetic band gap structure apparatus ED2 and the planar transmission line units TP1-TP4 in the slot E1 in a top view angle. A description is provided with reference to FIG. 3 to FIG. 4. The slot E1 has a rectangular shape, and its length and width may be designed depending on requirements. The planar transmission line units TP1-TP4 are arranged in the slot E1 and in two columns and two rows (that is, 2×2). The second conducting layer M2 and the planar transmission line units TP1-TP4 are all separated by the slot E1, and a separation distance may be designed depending on requirements. The second conducting layer M2 and the planar transmission line units TP1-TP4 are electrically isolated from one another.

In one embodiment, the planar conductor units CP1-CP4 are disposed corresponding to the planar transmission line units TP1-TP4. As shown in FIG. 4, the planar conductor unit CP1 is disposed corresponding to the planar transmission line unit TP1, the planar conductor unit CP2 is disposed corresponding to the planar transmission line unit TP2, and so forth.

Four corners of the second conducting layer M2 are respectively marked with contacts W1-W4, and bottoms of the contacts W1-W4 are respectively coupled to the first vias VF1-VF4. For example, the second conducting layer M2 is coupled to the planar conductor unit CP1 by using the first via VF1 on the bottom of the contact W1, so that the second conducting layer M2 and the planar conductor unit CP1 are electrically coupled. As for the coupling method of the remaining contacts W2-W4 and the planar conductor units CP2-CP4, it can be deduced by analogy.

As shown in FIG. 5, the planar transmission line units TP1-TP4 are all spiral conducting windings. The planar transmission line units TP1-TP4 are respectively marked with contacts X1-X4 at their approximate centers, and bottoms of the contacts X1-X4 are respectively coupled to the second vias VS1-VS4. For example, the planar transmission line unit TP1 is coupled to the extending end of the first conducting layer M1 in the slot G1 (surrounded by the planar conductor units CP1) by using the second via VS1 on the bottom of the contact X1. As for the coupling method of the remaining contacts X2-X4 and the first conducting layer M1 in the slits of the slots G2-G4, it can be deduced by analogy.

For example, the planar transmission line unit TP1 has a first terminal T1 and a second terminal T2. The first terminal T1 is located approximately at a center of the planar transmission line unit TP1, and the second terminal T2 is located approximately on an outer side of the planar transmission line unit TP1 (for example, an upper right corner of the planar transmission line unit TP1). In some embodiments, the second terminal T2 is in an open configuration.

Both a width and a length of the winding of, the planar transmission line unit TP1 may be designed depending on requirements. The winding starts from the second terminal T2 and is spirally wound towards the center according to a specific spacing (for example, inwardly wound in a counterclockwise direction) to the first terminal T1. In the present embodiment, the entire winding of the planar transmission line unit TP1 is in a rectangular shape. The first terminal T1 is coupled to the second via VS1 at the contact X1, so that the planar transmission line unit TP1 and the first conducting layer M1 are coupled to each other. As for the configuration of the remaining planar transmission line units TP2-TP4, it can be deduced by analogy.

Figure 6:
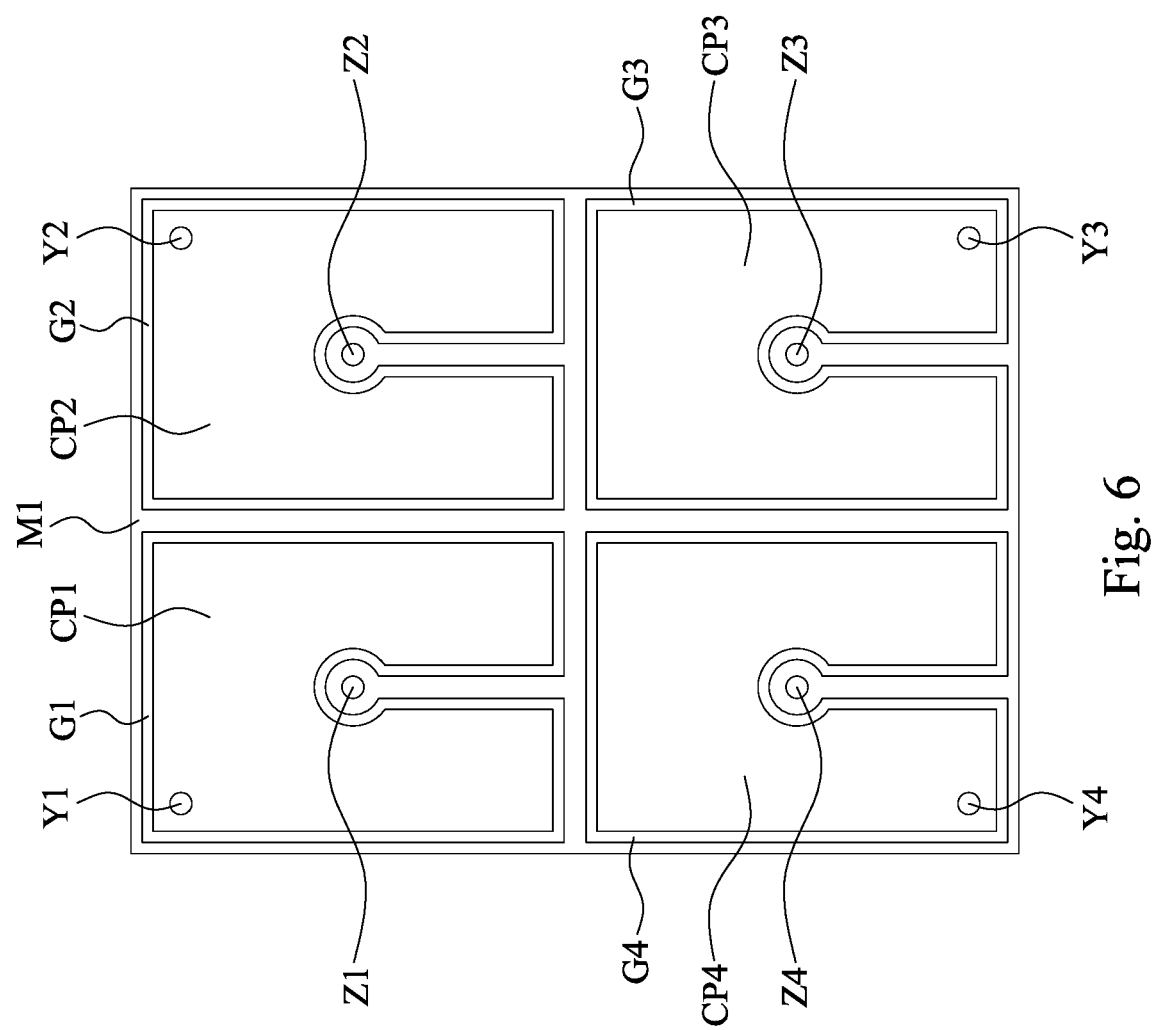
FIG. 6 depicts a schematic top view of the first conducting layer M1 of the electromagnetic band gap structure apparatus ED2.

FIG. 6 shows the first conducting layer M1 of an electromagnetic band gap structure apparatus ED and the planar conductor units CP1-CP4 in the slots G1-G4 depicted in a top view angle. A description is provided also with reference to FIG. 3 to FIG. 5. As shown in FIG. 6, the slots G1-G4 have a same length and a same width, but their length and width may be designed depending on requirements. A relative distance between the slots G1-G4 arranged on the first conducting layer M1 is adjustable.

As shown in FIG. 6, the first conducting layer M1 surrounds the planar conductor units CP1-CP4. On one side of each of the slots G1-G4, the first conducting layer M1 inwardly extends to centers of the planar conductor units CP1-CP4 along the slits of the slots G1-G4. Portions of the first conducting layer M1 extending into the slits are also separated from the planar conductor units CP1-CP4 by a certain distance. This distance may be different from a distance between the other sides of the planar conductor units CP1-CP4 and the first conducting layer M1.

As shown in FIG. 6, one corner of each of the planar conductor units CP1-CP4 are marked with contacts Y1-Y4, and tops of the contacts Y1-Y4 are respectively coupled to the first vias VF1-VF4. That is, the contacts Y1-Y4 are respectively coupled to the contacts W1-W4 of the second conducting layer M2 by using the first vias VF1-VF4. In this manner, the planar conductor units CP1-CP4 are electrically coupled to the second conducting layer M2 by using the first vias VF1-VF4 to form a first conductor structure.

As shown in FIG. 6, the portions of the first conducting layer M1 extending into the slits of the planar conductor units CP1-CP4 are marked with contacts Z1-Z4, and tops of the contacts Z1-Z4 are respectively coupled to the second vias VS1-VS4. That is, the contacts Z1-Z4 are respectively coupled to the contacts X1-X4 at centers of the planar transmission line units TP1-TP4 by using the second vias VS1-VS4. In this manner, the planar transmission line units TP1-TP4 are electrically conducted to the first conducting layer M1 by using the second vias VS1-VS4 to form a second conductor structure.

Figure 7:
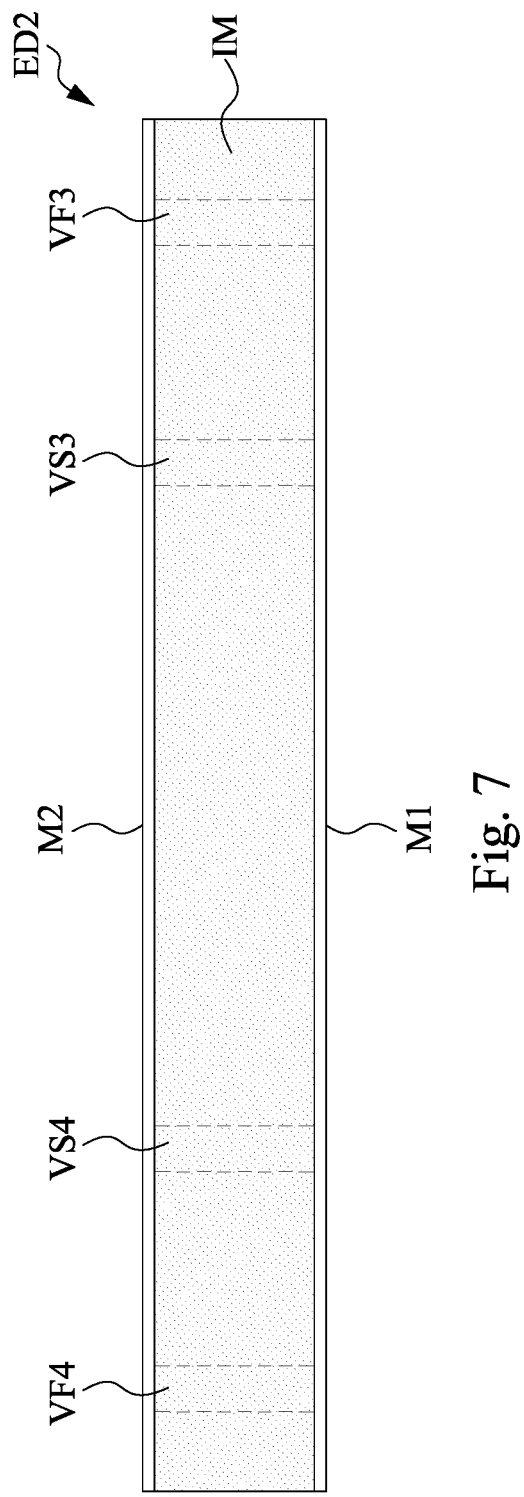
FIG. 7 depicts a side view of the electromagnetic band gap structure apparatus ED2.

FIG. 7 depicts a side view of the electromagnetic band gap structure apparatus ED2. As shown in FIG. 7, the insulating layer IM is filled between the first conducting layer M1 and the second conducting layer M2. The insulating layer IM has a specific height.

In the present embodiment, the planar conductor units CP1-CP4 and the second conducting layer M2 form the first conductor structure. The first conductor structure is coupled to the power voltage. The planar transmission line units TP1-TP4 and the first conducting layer M1 form the second conductor structure. The second conductor structure is coupled to the ground voltage. With the insulating layer IM, the two conductor structures are electrically isolated and arranged in a flipped manner.

Figure 8:
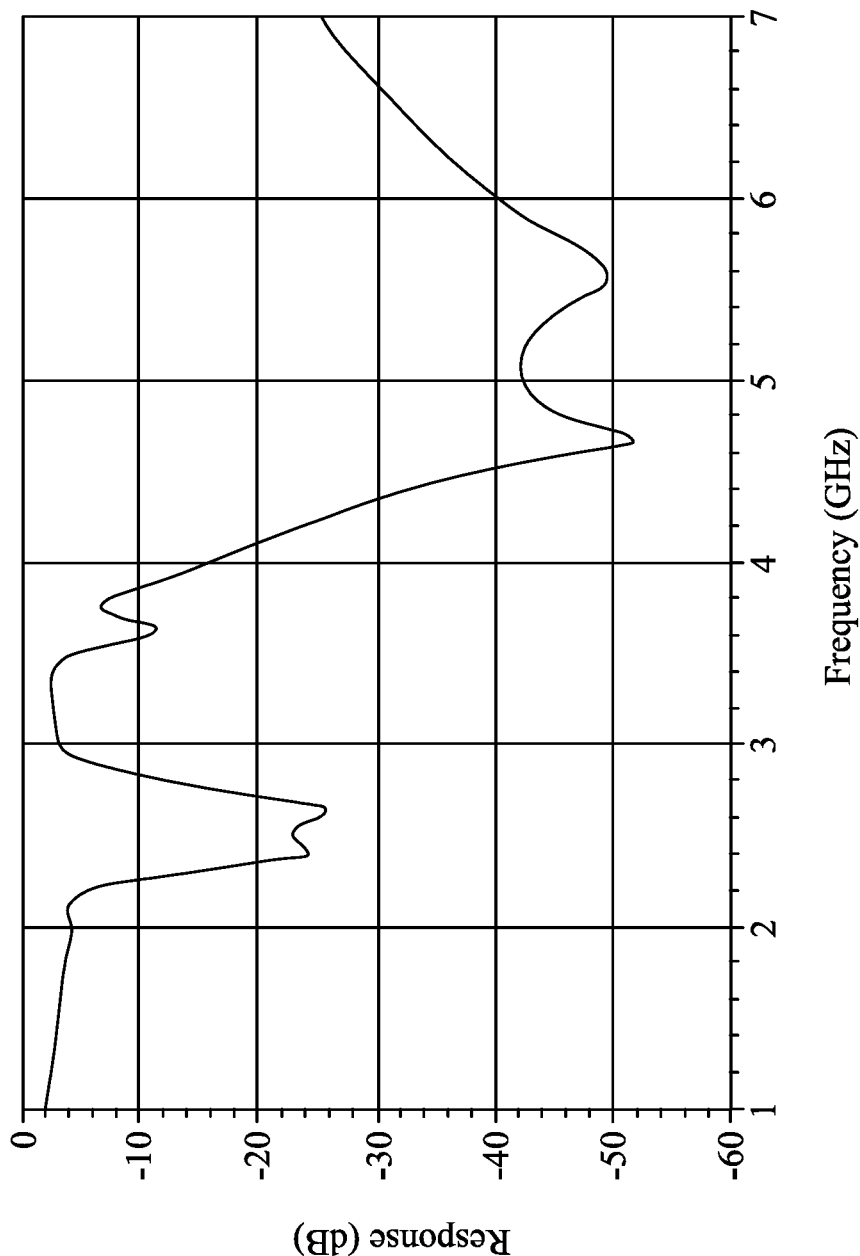
FIG. 8 is a schematic diagram of experimental results of the electromagnetic band gap structure apparatus ED2.

FIG. 8 is a schematic diagram of experimental results based on some embodiments of the present disclosure. The horizontal axis of FIG. 8 represents the frequency and the unit of frequency is gigahertz (GHz). The vertical axis of FIG. 8 represents the numerical value of response and the unit of response is decibel (dB). In some embodiments, two transmission ports (for example: a first port and a second port) are respectively disposed on two sides of the electromagnetic band gap structure apparatus ED2, and installation heights of the two transmission ports are between the first conducting layer M1 and the second conducting layer M2. At this time, the numerical value of response refers to the dual-port network parameter between the first port and the second port. The value of the dual-port network parameter may be the value of the second voltage divided by the first voltage. The first voltage is the voltage of the first port, and the second voltage is the transmission voltage of the second port.

The curve of FIG. 8 shows the change in response between the first port and the second port. The curve shows that the electromagnetic band gap structure apparatus ED2 has a response suppression effect of at least 23 dB at the first frequency band ranging from 2.4 GHz to 2.6 GHz, and a response suppression effect of at least 40 dB at the second frequency band ranging from 5 to 6 GHz. It can be applied to two different frequency bands of a wireless network (Wi-Fi) environment.

The electromagnetic band gap structure apparatus ED2 according to the foregoing embodiments is for illustration only, and is not intended to limit the present disclosure. Sizes and materials of various elements and slot parameters in the electromagnetic band gap structure apparatus ED2 may all be adjusted depending on practical needs, for example, a height between the first conducting layer M1 and the second conducting layer M2, a material of the insulating layer IM, the length and width of the slots G1-G4 that the first conducting layer M1 has, a size of the slot E1 that the second conducting layer M2 has, a length and width of the planar transmission line units TP1-TP4, the spacing of the planar transmission line units TP1-TP4, positions at which the first vias VF1-VF4 and the second vias VS1-VS4 are disposed, diameters and heights of the first vias VF1-VF4 and the second vias VS1-VS4. It should be understood that the corresponding features of the electromagnetic band gap structure apparatus ED1 are also the same, and sizes and materials of its various elements and slot parameters may all be adjusted depending on practical needs.

It should be understood that the first frequency band is determined according to the length of the planar transmission line units TP1-TP4, and the second frequency band is determined according to the length of the slots G1-G4 that the first conducting layer M1 has.

Based on the foregoing embodiments, the present disclosure provides two-layered electromagnetic band gap structure apparatuses ED1-ED2 that adopt a flipped design. As a result, they can be applied to a two-layered printed circuit board. This kind of electromagnetic band gap structure apparatuses ED1-ED2 has the structure of an open-stub resonator and a slot resonator at the same time, which can generate a dual-frequency noise suppression effect under the application environment of 802.11 wireless network protocol. The noise suppression effect can also be improved by disposing a plurality of electromagnetic band gap structure apparatuses ED1-ED2 around the noise generation site.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electromagnetic band gap structure apparatus, comprising:
    a first conducting layer having at least one first slot, each of the at least one first slot being arranged with a planar conductor unit, and the each planar conductor unit being coupled to a first via; and
    a second conducting layer in parallel with the first conducting layer, the second conducting layer having a second slot, and the second slot being arranged with at least one planar transmission line unit;
    wherein the each of the at least one planar transmission line unit is coupled to the first conducting layer through a second via, and the each first via is coupled to the second conducting layer;
    wherein one side of the each of the at least one first slot has an inwardly rotation design towards a planar conductor unit corresponding to the each of the at least one first slot, so that the first conducting layer has a plurality of extending ends that each extend to a slit of the each of the at least one first slot.

2. The electromagnetic band gap structure apparatus of claim 1, wherein the each of the at least one planar transmission line unit comprises a first terminal located at a center of the planar transmission line unit and a second terminal located on a relative outer side of the planar transmission line unit, and the first terminal and the second terminal are electrically coupled through a spiral transmission line winding.

3. The electromagnetic band gap structure apparatus of claim 2, wherein the first terminal is electrically coupled to the second via.

4. The electromagnetic band gap structure apparatus of claim 2, wherein the second terminal is in an open configuration.

5. The electromagnetic band gap structure apparatus of claim 1, wherein the first conducting layer is coupled to a ground voltage, and the second conducting layer is coupled to a power voltage.

6. The electromagnetic band gap structure apparatus of claim 1, wherein the first conducting layer is electrically isolated from the each planar conductor unit, and the second conducting layer is electrically isolated from the each of the at least one planar transmission line unit.

7. The electromagnetic band gap structure apparatus of claim 1, wherein the second via is coupled to one of the plurality of extending ends.

8. The electromagnetic band gap structure apparatus of claim 1, wherein the each of the at least one first slot is conformal with the each planar conductor unit.

9. The electromagnetic band gap structure apparatus of claim 1, wherein the first via is coupled to a corner of the each planar conductor unit and portions of the second conductive layer located outside the second slot.

10. The electromagnetic band gap structure apparatus of claim 1, wherein an insulating layer is filled between the first conducting layer and the second conducting layer, and the insulating layer allows the first conducting layer to be electrically isolated from the second conducting layer.

11. The electromagnetic band gap structure apparatus of claim 1, wherein the first via and the second via are approximately perpendicular to the first conducting layer and the second conducting layer.

12. The electromagnetic band gap structure apparatus of claim 1, wherein the second slot has a rectangular shape on the second conducting layer.

13. The electromagnetic band gap structure apparatus of claim 1, wherein the each planar conductor unit is surrounded by the first conducting layer, and the at least one planar transmission line unit is surrounded by the second conducting layer.

14. The electromagnetic band gap structure apparatus of claim 13, wherein the each planar conductor unit is coupled to the second conducting layer through the first via to form a first conductor structure, the at least one planar transmission line unit is coupled to the first conducting layer through respective second vias to form a second conductor structure, and the first conductor structure is electrically isolated from the second conductor structure.

15. The electromagnetic band gap structure apparatus of claim 14, wherein the first conductor structure and the second conductor structure are disposed beside at least one transmission port, and are configured to suppress noise when the transmission port performs signal transmission according to a first frequency band and a second frequency band.

16. The electromagnetic band gap structure apparatus of claim 15, wherein the first frequency band ranges approximately from 2.4 GHz to 2.6 GHz, and the second frequency band ranges approximately from 5 to 6 GHz.

17. The electromagnetic band gap structure apparatus of claim 1, wherein a number of the at least one first slot is four, a number of planar conductor units is four, and a number of the at least one planar transmission line unit is four.

18. The electromagnetic band gap structure apparatus of claim 17, wherein the planar conductor units are arranged in two columns and two rows and are arranged in the first slots and adjacent to one another, and the planar transmission line units are arranged in two columns and two rows and are arranged in the second slot, wherein the planar conductor units are disposed corresponding to the planar transmission line units.

19. An electromagnetic band gap structure apparatus, comprising:
- a first conducting layer having a plurality of first slots, wherein the plurality of first slots are arranged with a plurality of planar conductor units, respectively; and
- a second conducting layer in parallel with the first conducting layer, wherein the second conducting layer has a second slot, and the second slot is arranged with a plurality of planar transmission line units;
- wherein each of the plurality of planar conductor units is coupled to the second conducting layer through a first via having a number of one, and the plurality of planar transmission line units are coupled to the first conducting layer through a plurality of second vias, respectively.

* * * * *